(12) United States Patent
Jung et al.

(10) Patent No.: US 6,721,208 B2
(45) Date of Patent: Apr. 13, 2004

(54) METHOD OF ERASING FLASH MEMORY CELLS

(75) Inventors: Sung Mun Jung, Kyungki-Do (KR); Jum Soo Kim, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/315,246

(22) Filed: Dec. 10, 2002

(65) Prior Publication Data

US 2004/0013002 A1 Jan. 22, 2004

(30) Foreign Application Priority Data

Jul. 18, 2002 (KR) .................................. 10-2002-42165

(51) Int. Cl.[7] .............................................. G11C 16/04
(52) U.S. Cl. .............................. 365/185.33; 365/185.27; 365/185.29
(58) Field of Search ....................... 365/185.27, 185.29, 365/185.33

(56) References Cited

U.S. PATENT DOCUMENTS

| | | | | |
|---|---|---|---|---|
| 5,894,438 A | * | 4/1999 | Yang et al. | 365/185.18 |
| 5,978,277 A | * | 11/1999 | Hsu et al. | 365/185.29 |
| 6,614,693 B1 | * | 9/2003 | Lee et al. | 365/185.29 |
| 2001/0043492 A1 | * | 11/2001 | Lee et al. | 365/185.29 |
| 2002/0012274 A1 | * | 1/2002 | Lee | 365/185.29 |
| 2002/0075727 A1 | * | 6/2002 | Jeong et al. | 365/185.28 |

* cited by examiner

*Primary Examiner*—Son Mai
(74) *Attorney, Agent, or Firm*—Morgan, Lewis & Bockius LLP

(57) ABSTRACT

The present invention relates to a method of erasing flash memory cells. In the flash memory cell having a substrate, a source, a drain, a tunnel oxide film, a floating gate, a dielectric film and a control gate, the method of erasing the flash memory cell comprises the steps of performing an erase operation for the cell, by applying a negative voltage being an erase voltage to the control gate and a positive voltage being an erase voltage to the substrate, discharging the control gate by making the control gate grounded, discharging the source by making the source grounded, and simultaneously performing a discharge operation and a recovery operation by making the substrate grounded. Therefore, the threshold voltages of the cells can be converted to have a constant voltage even though additional recovery operation is not performed.

7 Claims, 3 Drawing Sheets

METHOD OF ERASING FLASH MEMORY CELLS

BACKGROUND OF THE INVENTION

1. Field of the Invention

The invention relates generally to a method of erasing flash memory cells, and more particularly to, a method of erasing flash memory cells by which a recovery operation and an erase operation are simultaneously performed by changing a method of discharging the flash memory after the memory is erased.

2. Description of the Prior Art

Generally, in a flash memory, in order to make constant distribution of the threshold voltage (Vt) upon an erase operation, a pre-program operation is first performed to set the threshold voltages of the cells to be erased and an erase operation is then performed. After the erase operation is performed, a post-program and a recovery operation are performed so that the cells that may have been over erased are converged to have a constant threshold voltage.

A conventional method of erasing the flash memory will be described by reference to FIG. 1.

FIG. 1 is flowchart for explaining the conventional method of erasing the flash memory cells. A pre-program operation for increasing the threshold voltage of each of the cells by programming the cells in a selected block (eleventh step) and a verify operation are performed (twelfth step), before the erase operation for the flash memory device is performed. The pre-program operation is performed for the purpose of preventing a phenomenon that the cells are over erased since most of the already-erased cells have further low threshold voltages if these cells are again erased. After the verify operation, the threshold voltages of the entire cells are adjusted and are erased in a block unit (thirteenth step). Next, the erase state is verified (fourteenth step). As a result of verification, if erase is not sufficient, the erase operation is again performed. This series of the operations are repeated. After all the cells are erased, in order to solve the over-erasing problem for some cells having an erase characteristic of a relatively fast speed, the recovery operation for preventing a leakage current by mean of some programming operation (fifteenth step) and the verify operation are performed (sixteenth step), thus completing the erase operation for the flash memory device.

During the erase operation (thirteenth step) and the verify operation (fourteenth), if the cells having the erase characteristic of a low speed do not fall below a given threshold voltage (for example, 2V), erase pulses are applied to all the cells. At this time, the cells having a fast erase characteristic are over erased. If the leakage currents of the over-erased cells are over an allowable level, the threshold voltage of the cells can be increased in the recovery operation. However, if the leakage currents are over the allowable limit, these chips are a fail. Fail of the recovery operation in the flash memory is the most important problem in decreasing the yield.

The conventional method of erasing the flash memory cells will be explained in further detail.

FIG. 2 is a cross sectional view of the flash memory cell for explaining the conventional method of erasing the cell. The flash memory cell includes a semiconductor substrate 20, a source region 22, a drain 24, a floating control gate 26 and a control gate 28. At this time, for convenience of explanation, it is assumed that a voltage applied to the substrate is $V_b$, and voltages applied to the source, the drain and the control gate are $V_S$, $V_D$ and $V_g$, respectively.

First, in order to erase the cells of the flash memory, $-8V$ is applied to $V_g$ and 8V is applied to $V_b$. Then, electric charges within the floating control gate 26 exit in the substrate 20 by means of a F-N tunneling method. At this time, if the source 22 and the drain 24 are floated, the substrate is a P type and a junction is an N type, a voltage of about 7.3V is actually applied to the source and the drain since the substrate and the junction are in a forward bias state. Thereafter, after the erase operation is completed, a discharge operation is performed. First, in a state that the control gate is grounded, $V_g$ is discharged to 0V and $V_b$ is also discharged to 0V.

Next, if the erase operation for the flash memory cell is finished, the recovery operation is performed. Upon the recovery operation, $V_g$, $V_b$ and $V_S$ are grounded and 5V is applied to $V_D$, so that the over-erased cells are converged to have a constant threshold voltage.

SUMMARY OF THE INVENTION

The present invention is contrived to solve the above problems and an object of the present invention is to provide a method of erasing flash memory cells by which a recovery operation and an erase operation are simultaneously performed so that the cells are converged to have a constant threshold voltage, by changing a method of discharging the flash memory after the memory is erased.

In order to accomplish the above object, a method of erasing the flash memory cell having a substrate, a source, a drain, a tunnel oxide film, a floating gate, a dielectric film and a control gate according to the present invention, is characterized in that it comprises the steps of performing an erase operation for the cell, by applying a negative voltage being an erase voltage to the control gate and a positive voltage being an erase voltage to the substrate, discharging the control gate by making the control gate grounded, discharging the source by making the source grounded, and simultaneously performing a discharge operation and a recovery operation by making the substrate grounded.

In order to accomplish the above object, a method of erasing the flash memory cell having a substrate, a source, a drain, a tunnel oxide film, a floating gate, a dielectric film and a control gate according to the present invention, is characterized in that it comprises the steps of performing an erase operation for the cell by applying a negative voltage being an erase voltage to the control gate, a positive voltage being an erase voltage to the source and the drain and making the substrate grounded, discharging the control gate by making the control gate grounded, and discharging the source and drain voltages toward the source and by making the source grounded and simultaneously performing a recovery operation for the cell.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
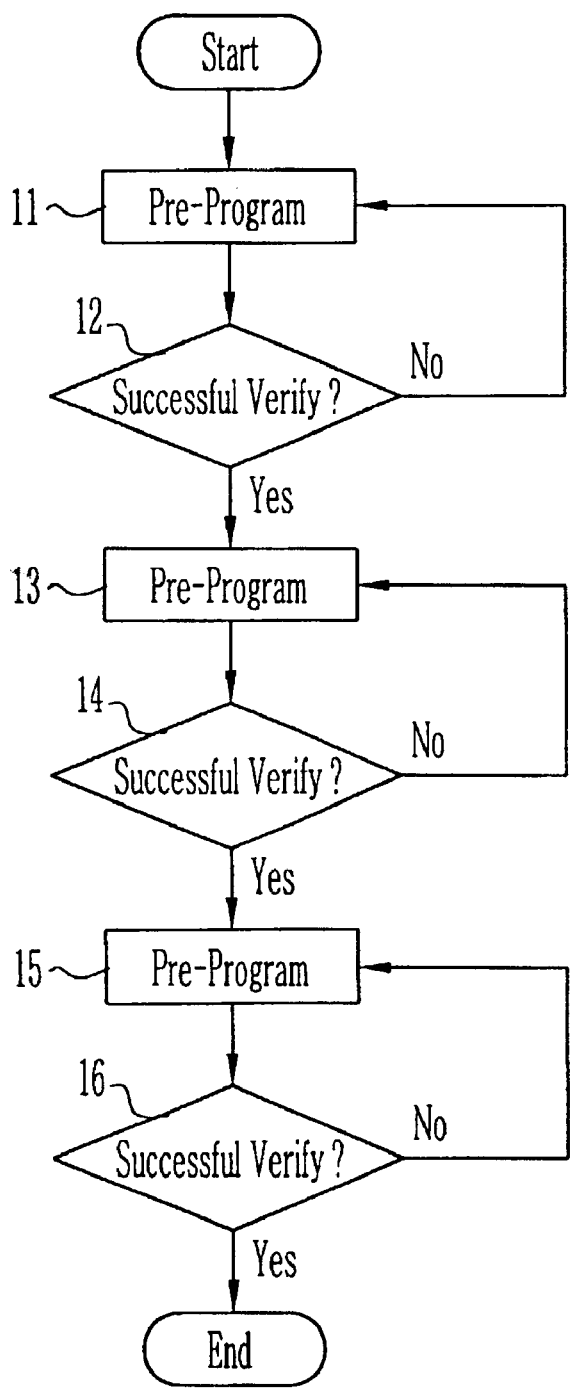
FIG. 1 is flowchart for explaining a conventional method of erasing flash memory cells.

The present invention will be described in detail by way of a preferred embodiment with reference to accompanying drawings, in which like reference numerals are used to identify the same or similar parts.

Figure 3A:
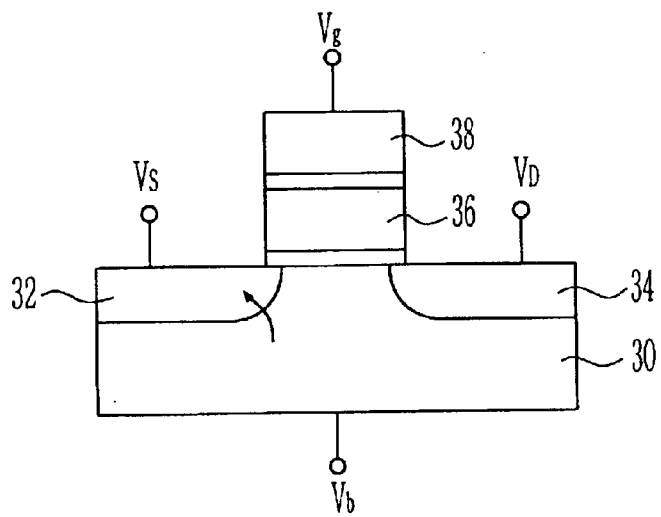
FIG. 3A and FIG. 3B are cross sectional view of flash memory cells for explaining a method of erasing the flash memory cells according to a preferred embodiment of the present invention.
Figure 3B:
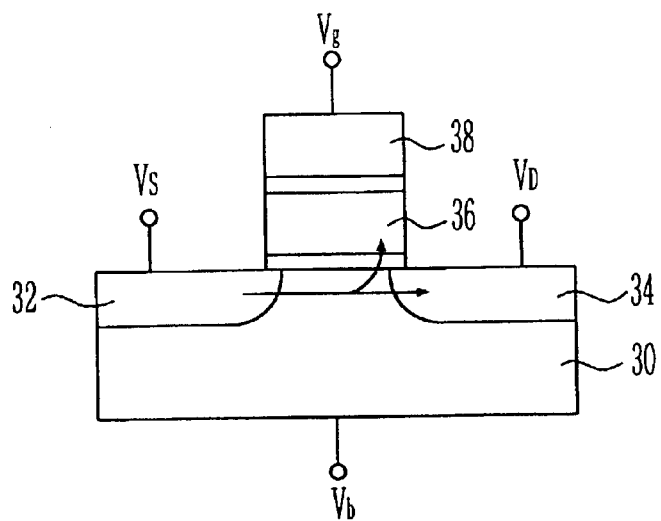

FIG. 3A and FIG. 3B are cross sectional view of flash memory cells for explaining a method of erasing the flash memory cells according to a preferred embodiment of the present invention. The flash memory cell includes a semiconductor substrate 30, a source region 32, a drain region 34, a floating control gate 36 and a control gate 38. At this time, for convenience of explanation, it is assumed that a voltage applied to the substrate 30 is $V_b$, and voltages applied to the source 32, the drain 34 and the control gate 38 are $V_S$, $V_D$ and $V_g$, respectively.

Figure 2:
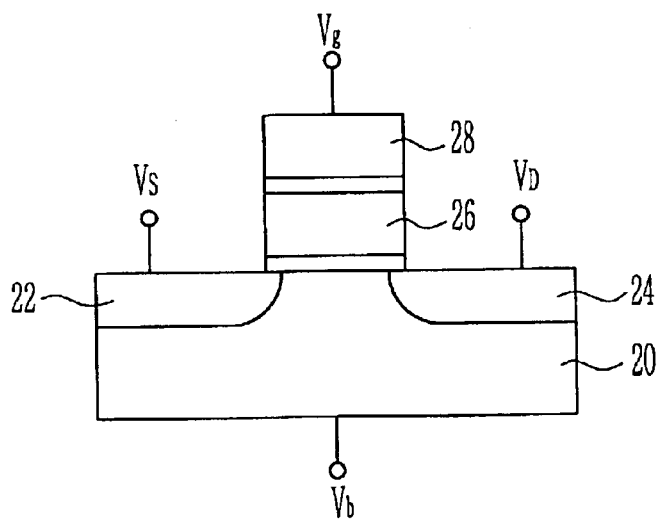
FIG. 2 is a cross sectional view of the flash memory cell for explaining the conventional method of erasing the cell.

In the erase operation of the flash memory, as described by reference to FIG. 2, −5 through −10V, preferable −8V is applied to $V_g$ and 5 through 10V, preferably 8V is applied to $V_b$. Therefore, if −8V is applied to $V_g$ and 8V is applied to $V_b$, the source and the drain are floated and are thus applied with a bias of about 7.3V. After the erase operation, in order to perform a discharge operation according to the present invention, $V_g$ is ground and the control gate voltage is first discharged. Next, in order to discharge the source, $V_S$ is grounded. Thus, as shown in FIG. 3A, when the source is switched to 0V, if the substrate is a P type and the junction is an N type, current flows in an arrow direction since the substrate and the source region are in a forward bias state, so that the source is discharged. Then, the substrate is grounded. The moment $V_S$ and $V_b$ become 0V, the substrate and the drain are in a reverse bias state and are thus applied with about 7.3V. This is the same bias state to the recovery operation for the flash memory that was described in the prior art. In other words, this is the same bias state to that the recovery operation was performed by applying 0V to $V_g$, $V_b$ and $V_S$ and 5V to $V_D$. Referring to FIG. 3B, if 0V is applied to $V_S$ and $V_b$, respectively, electrons are moved in the arrow direction. Thus, the recovery operation is automatically performed during the time when the drain is discharged and additional recovery operation is thus not required.

Or, as described above, the source ($V_S$) is grounded and the voltage is first discharged toward the source. Similarly to the method of grounding the substrate, a method of simultaneously discharging the voltages of the substrate toward the source and the substrate in a state that the source ($V_S$) and the substrate ($V_b$) are simultaneously grounded, may be used.

A method of erasing the flash memory according to another embodiment of the present invention will be now described.

In order to erase the cell, the source and the drain are floated, −5 through −10V, preferably −8V is applied to the control gate ($V_g$), and 5 through 10 V, preferably 8V is applied to the substrate ($V_b$). Next, in order to perform the discharge operation, the control gate is first discharged in a state that $V_g$ is grounded. After the drain voltage, $V_D$ is discharged to 4.5V, the source ($V_S$) and the substrate ($V_b$) are discharged in a state them are simultaneously grounded. This is because the junction may be damaged since the difference in the voltage between the substrate and the drain is instantly increased to about 7.3V, if the source and the substrate are grounded in an ideal state that the leakage current of the drain junction is very small. Therefore, if the method of discharging the drain voltage to 4.5V is used before the source and the substrate are discharged, damage of the junction can be prevented. At this time, it is preferred that the time to maintain $V_D$ at 4.5V is 10 through 500 $\mu$s. Also, it is preferred that the drain current is kept until the drain current per column is below 100 $\mu$A when the drain voltage becomes 4.5V.

A method of erasing the flash memory according to still another embodiment of the present invention will be below described.

Upon an erase operation of the flash memory cell, an erase method in which −5 through −10V, preferably −8V is applied to $V_g$, 5V through 7V is applied to $V_S$ and $V_D$ and the substrate ($V_b$) is grounded is first used. After the erase operation is finished, upon a discharge operation of the flash memory cell, the discharge method in which $V_g$ is first discharged in a state that $V_g$ is grounded and $V_S$ is then grounded to discharge the source and drain voltages toward the source may be used.

Figure 4:
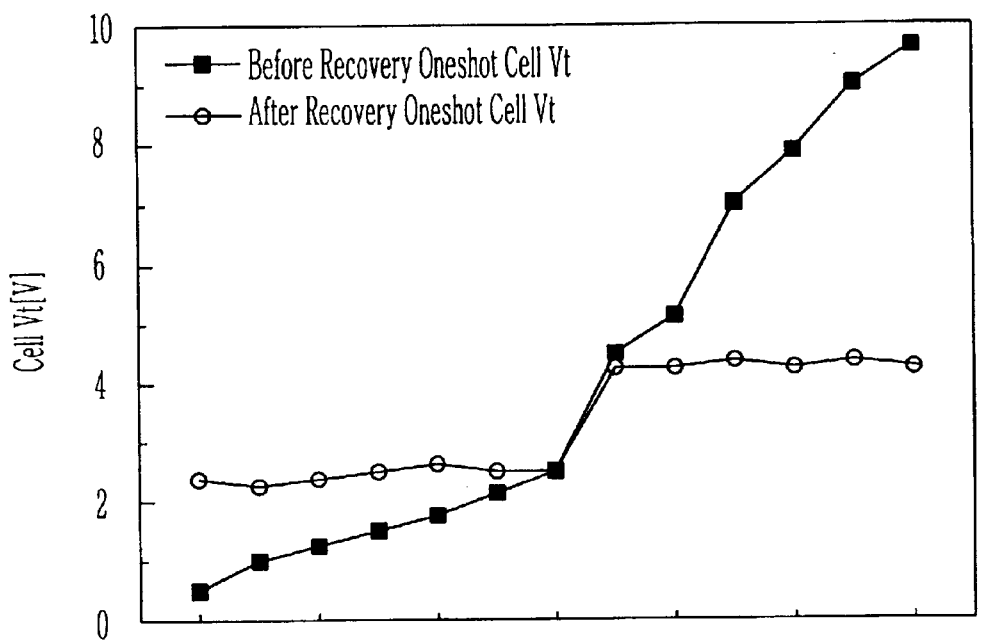
FIG. 4 is a graph for explaining the difference in the threshold voltage of the cells after a recovery operation is performed using the method of erasing is the flash memory cells of the present invention.

Referring now to FIG. 4, FIG. 4 is a graph for explaining the difference in the threshold voltages of the cells after the recovery operation is performed using the method of erasing the flash memory cells of the present invention. In FIG. 4, closed squares in the graph represent distribution of the threshold voltage (Vt) before the recovery operation for the cells is performed. Also, open circles represent distribution of the threshold voltage (Vt) after the erase operation of the present invention is performed.

In other words, if the method of erasing the flash memory of the present invention is used, it can be seen that the threshold voltages of the cells are converted to have 2.2V. Further, if the method of erasing the flash memory of the present invention is used, the pre-program operation by which the threshold voltages of the cells to be erased are set to be constant since the flash memory cells have a self-convergent characteristic, may be omitted.

As mentioned above, according to the present invention, a recovery operation is simultaneously performed upon an erase operation, by changing a method of discharging the flash memory cells after the flash memory cells are erased. Therefore, the present invention has an advantageous effect that the threshold voltages of the cells are converted to have a constant voltage without performing additional recovery operation.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of erasing a flash memory cell having a substrate, a source, a drain, a tunnel oxide film, a floating gate, a dielectric film and a control gate, comprising the steps of:
   (a) performing an erase operation for the cell, by applying a negative voltage being an erase voltage to the control gate and a positive voltage being an erase voltage to the substrate;

(b) discharging the control gate by making the control gate grounded;

(c) discharging the source by making the source grounded; and (d) simultaneously performing a discharge operation and a recovery operation by making the substrate grounded.

2. The method as claimed in claim 1, wherein the negative voltage being the erase voltage is −5 through −10V and the positive voltage being the erase voltage is 5 through 10V.

3. The method as claimed in claim 1, wherein the step (c) and the step (d) includes discharging the source and the substrate and simultaneously performing the recovery operation for the cell, by making the source and the substrate grounded at the same time.

4. The method as claimed in claim 1, further comprising the step of dropping the drain bias to a given voltage after the step (b).

5. The method as claimed in claim 4, wherein the given voltage is 4.5V, and the given voltage is kept for 10 through 500 $\mu$s after the drain bias is dropped to 4.5V.

6. A method of erasing a flash memory cell having a substrate, a source, a drain, a tunnel oxide film, a floating gate, a dielectric film and a control gate, comprising the steps of:

(a) performing an erase operation for the cell by applying a negative voltage being an erase voltage to the control gate, a positive voltage being an erase voltage to the source and the drain and making the substrate grounded;

(b) discharging the control gate by making the control gate grounded; and (c) discharging the source and drain voltages toward the source by making the source grounded, and simultaneously performing a recovery operation for the cell.

7. The method as claimed in claim 6, wherein the negative voltage being the erase voltage is −5 through −10V and the positive voltage being the erase voltage is 5 through 7V.

* * * * *